(12) United States Patent
Saenger et al.

(10) Patent No.: US 7,396,407 B2
(45) Date of Patent: Jul. 8, 2008

(54) TRENCH-EDGE-DEFECT-FREE RECRYSTALLIZATION BY EDGE-ANGLE-OPTIMIZED SOLID PHASE EPITAXY: METHOD AND APPLICATIONS TO HYBRID ORIENTATION SUBSTRATES

(75) Inventors: Katherine L. Saenger, Ossining, NY (US); Chun-yung Sung, Poughkeepsie, NY (US); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/406,123

(22) Filed: Apr. 18, 2006

(65) Prior Publication Data

US 2007/0241323 A1    Oct. 18, 2007

(51) Int. Cl.
*C30B 21/04* (2006.01)
(52) U.S. Cl. .................. 117/63; 117/53; 117/43; 257/347; 257/627; 438/486; 438/406
(58) Field of Classification Search .............. 117/53, 117/58, 63, 101, 43; 438/486, 187, 795, 438/223, 406; 257/351, E21.001, E29.001, 257/213, 347, 627
See application file for complete search history.

(56) References Cited

U.S. PATENT DOCUMENTS

| 7,253,034 | B2 | 8/2007 | Chan et al. | |
|---|---|---|---|---|
| 2006/0091427 | A1* | 5/2006 | Waite et al. | 257/213 |
| 2006/0276011 | A1* | 12/2006 | Fogel et al. | 438/486 |
| 2006/0292770 | A1* | 12/2006 | Wu et al. | 438/187 |

OTHER PUBLICATIONS

U.S. Appl. No. 11/142,646 entitled "Amorphization/Templated Recrystallization Method for Hybrid Orientation Substrates" filed on Jun. 1, 2005, First Named Inventor: Keith Fogel.
U.S. Appl. No. 10/250,241 entitled "High Performance CMOS Devices on Hybrid Crystal Oriented Substrates" filed on Jun. 17, 2003, First Named Inventor: Bruce Doris.
Yang, M. et al. "High Performance CMOS Fabricated on Hybrid Substrate with Different Crystal Orientations," IEDM 2003 Paper 18.7.
Burbure, N. et al., "The effect of oxide trenches on defect formation and evolution in ion-implanted silicon" Mat. Res. Soc. Symp. Proc. 810 C4.19.1 (2004).
Sanuki, T. et al., "New Stress Inducing Technique of Epitaxial Si on Recessed S/D Fabricated in Substrate Strained-Si of <100>- Channel on Rotated Wafers," in IEDM 2004 Paper 9.3.
Komoda, T. et al., "Mobility Improvement for 45nm Node by Combination of Optimized Stress Control and Channel Orientation Design" 2004 IEEE, IEDM, 9.3.1 - 9.3.4.

* cited by examiner

*Primary Examiner*—Steven P. Griffin
*Assistant Examiner*—Seyed Masoud Malekzadeh
(74) *Attorney, Agent, or Firm*—Scully, Scott, Murphy & Presser, P.C.; Robert M. Trepp, Esq.

(57) ABSTRACT

The present invention discloses the use of edge-angle-optimized solid phase epitaxy for forming hybrid orientation substrates comprising changed-orientation Si device regions free of the trench-edge defects typically seen when trench-isolated regions of Si are recrystallized to the orientation of an underlying single-crystal Si template after an amorphization step. For the case of amorphized Si regions recrystallizing to (100) surface orientation, the trench-edge-defect-free recrystallization of edge-angle-optimized solid phase epitaxy may be achieved in rectilinear Si device regions whose edges align with the (100) crystal's in-plane <100> directions.

8 Claims, 12 Drawing Sheets

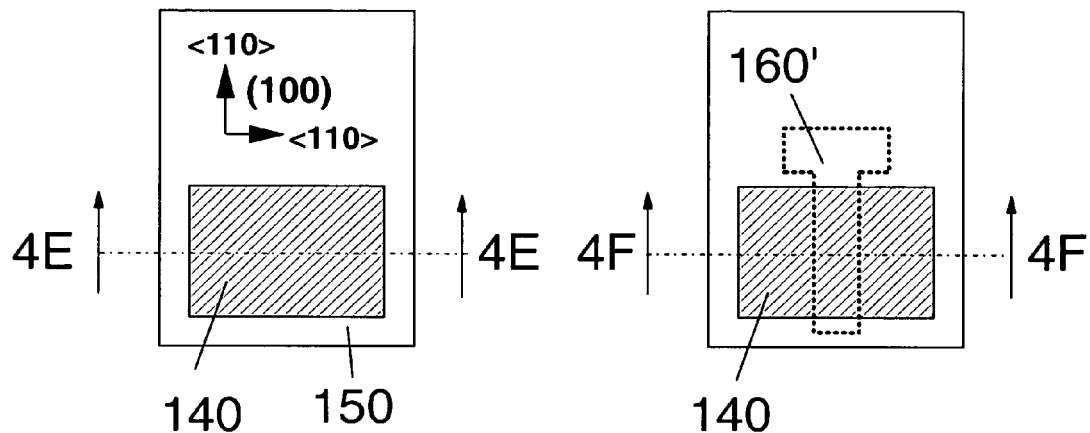
FIG. 4A
PRIOR ART
FIG. 4B
PRIOR ART
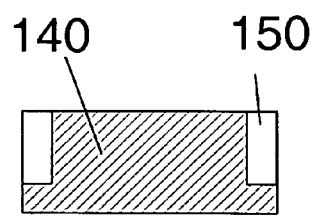
FIG. 4E
PRIOR ART
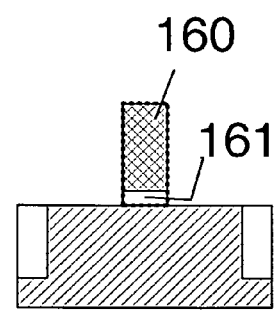
FIG. 4F
PRIOR ART

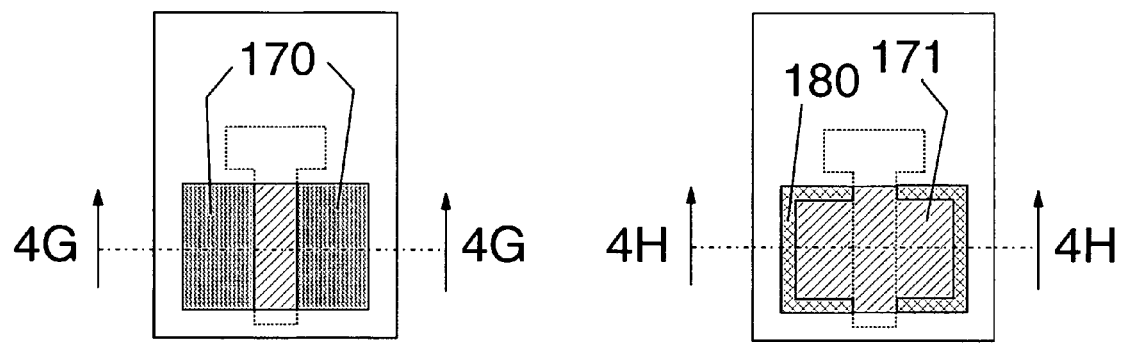
FIG. 4C
PRIOR ART
FIG. 4D
PRIOR ART
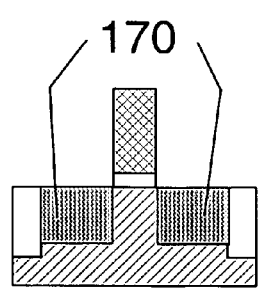
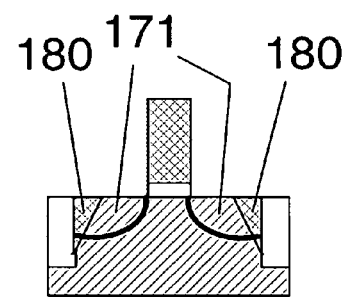
FIG. 4G
PRIOR ART
FIG. 4H
PRIOR ART

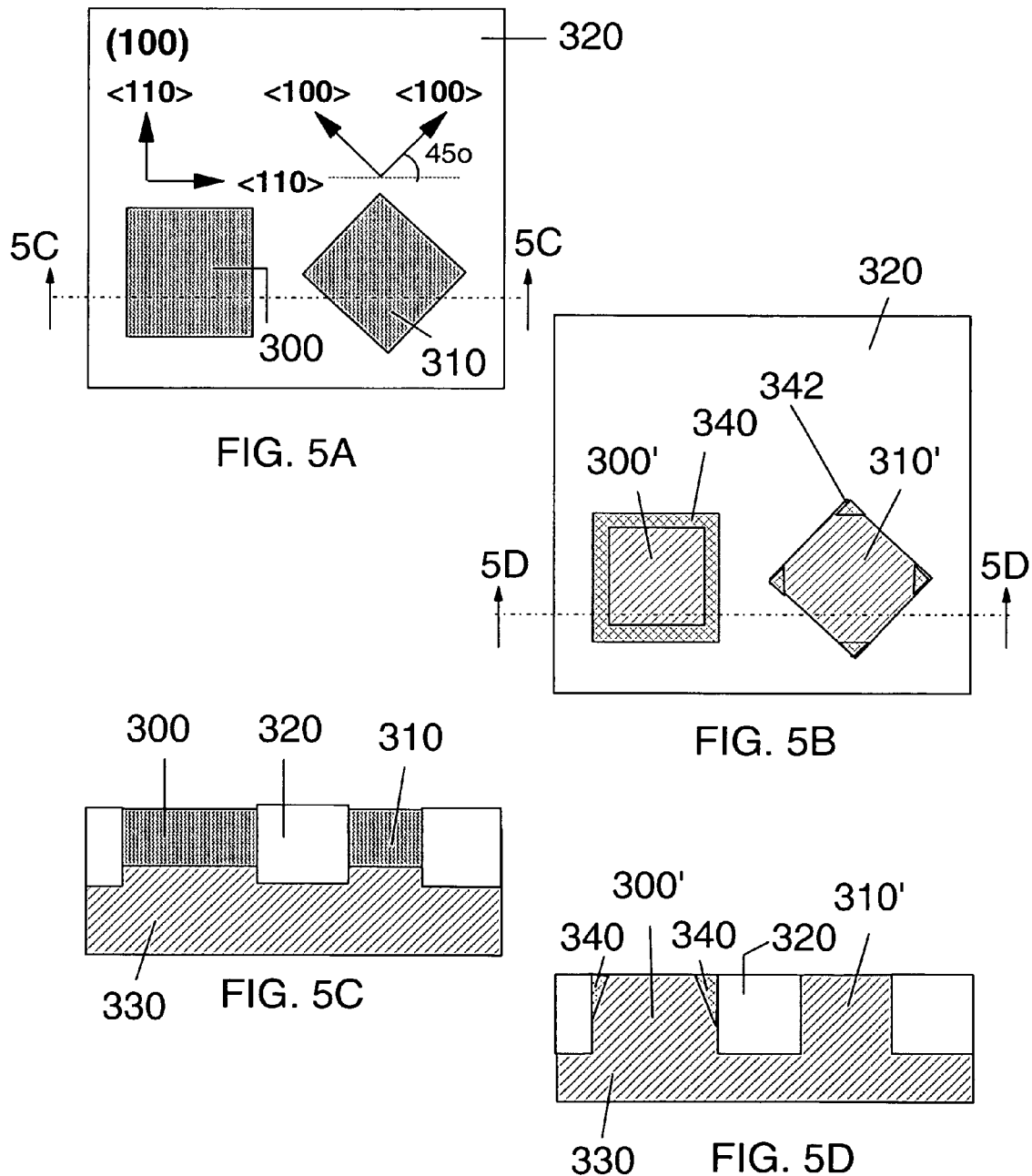

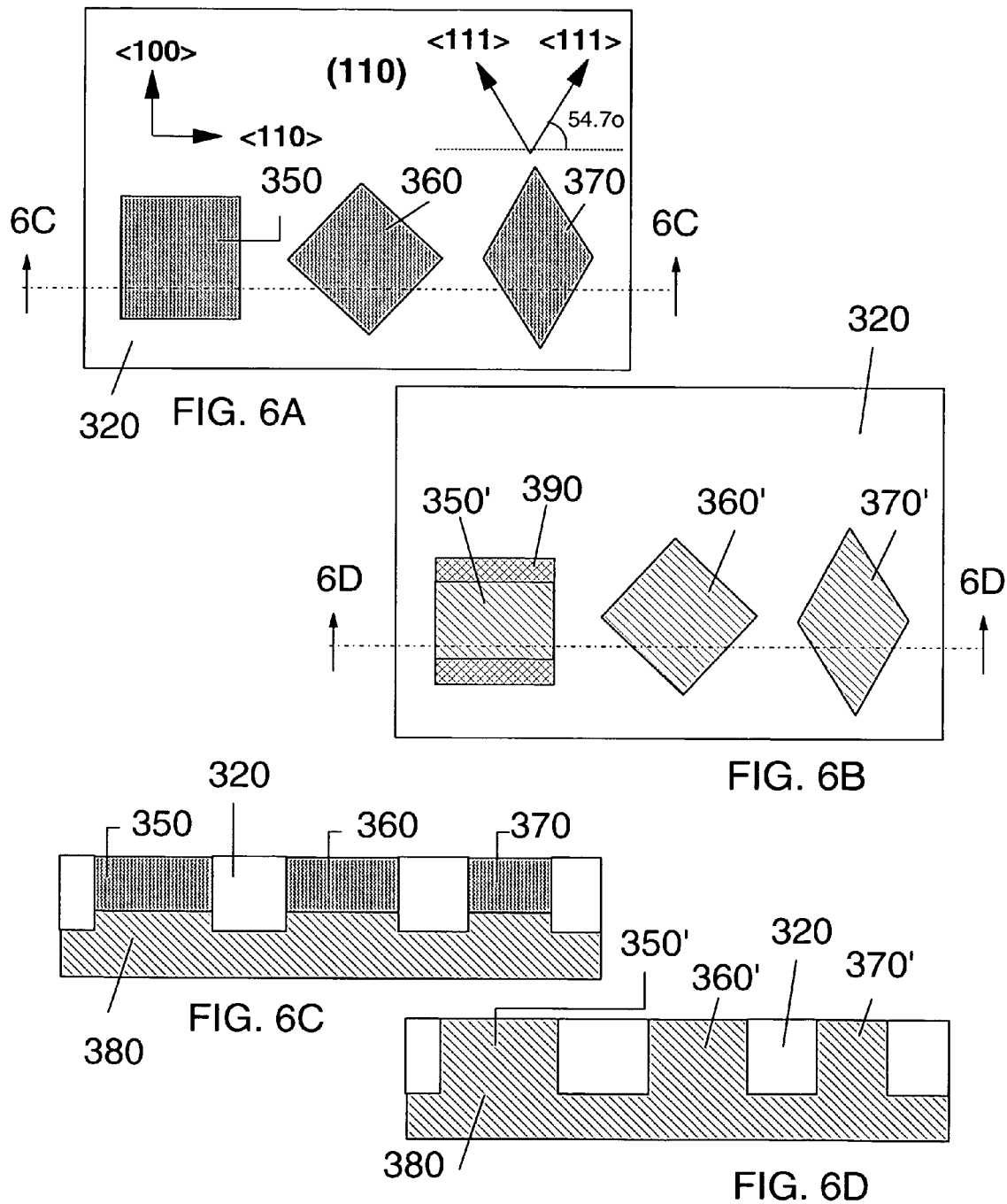

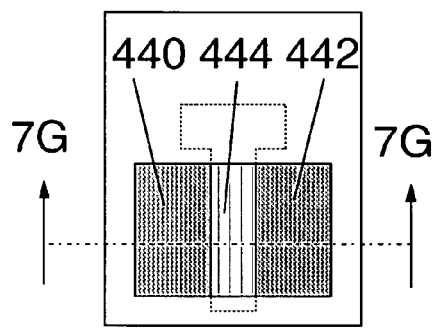
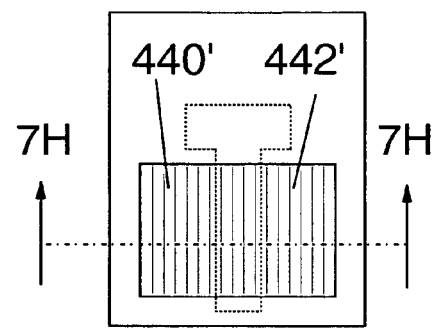
FIG. 7C
FIG. 7D
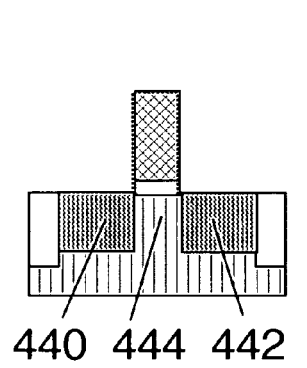
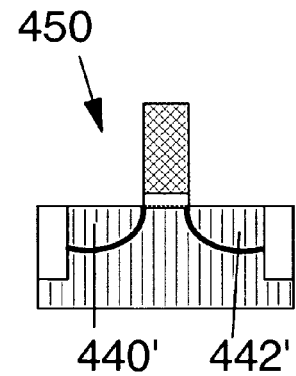
FIG. 7G
FIG. 7H

TRENCH-EDGE-DEFECT-FREE RECRYSTALLIZATION BY EDGE-ANGLE-OPTIMIZED SOLID PHASE EPITAXY: METHOD AND APPLICATIONS TO HYBRID ORIENTATION SUBSTRATES

RELATED APPLICATIONS

This application is related to U.S. patent application Ser. No. 10/725,850 filed Dec. 2, 2003 entitled "Planar substrate with selected semiconductor crystal orientations formed by localized amorphization and recrystallization of stacked template layers," to U.S. patent application Ser. No. 10/902,557 filed Jul. 29, 2004 entitled "Dual SIMOX hybrid orientation technology (HOT) substrates," and to U.S. patent application Ser. No. 11/142,646 filed Jun. 1, 2005 entitled "Improved amorphization/templated recrystallization method for hybrid orientation substrates." The contents of each of the aforementioned U.S. Patent Applications are incorporated herein by reference in their entirety.

FIELD OF THE INVENTION

The present invention relates to high performance complementary metal oxide semiconductor (CMOS) circuits in which p-channel field effect transistors (pFETs) are disposed in single-crystal semiconductor device regions having a first surface orientation optimal for hole mobility and n-channel FETs (nFETs) are disposed in single-crystal semiconductor device regions having a second surface orientation different from the first that is optimal for electron mobility, as well as to the hybrid orientation substrates on which these CMOS circuits are formed. More particularly, this invention relates to the use of twist-angle-optimized bonding and edge-angle-optimized solid phase epitaxy for forming hybrid orientation substrates comprising changed-orientation Si device regions free of the trench-edge defects typically seen when trench-isolated regions of Si are recrystallized to the orientation of an underlying single-crystal Si template after an amorphization step.

BACKGROUND OF THE INVENTION

Semiconductor device technology is increasingly relying on specialty semiconductor substrates to improve the performance of the n-channel MOSFETs (nFETs) and p-channel MOSFETs (pFETs) in complementary metal oxide semiconductor (CMOS) circuits. For example, the strong dependence of carrier mobility on silicon surface orientation has led to increased interest in hybrid orientation Si substrates in which nFETs are formed in Si with a (100) surface orientation (the orientation in which electron mobility is higher) and pFETs are formed in Si with a (110) surface orientation (the orientation in which hole mobility is higher), as described by M. Yang, et al. in "High Performance CMOS Fabricated on Hybrid Substrate with Different Crystal Orientations," IEDM 2003 Paper 18.7 and U.S. patent application Ser. No. 10/250,241, filed Jun. 17, 2003 entitled "High-performance CMOS SOI devices on hybrid crystal-oriented substrates."

Amorphization/templated recrystallization (ATR) methods for fabricating hybrid orientation substrates such as those disclosed in U.S. patent application Ser. No. 10/725,850, supra, typically start with a first semiconductor layer having a first surface orientation directly bonded to a second semiconductor layer having a second surface orientation different from the first. Selected areas of the first semiconductor layer are amorphized by ion implantation, and then recrystallized into the orientation of the second semiconductor layer using the second semiconductor layer as a crystal template.

FIGS. 1A-1D show a "top amorphization/bottom templating" version of the ATR method of U.S. patent application Ser. No. 10/725,850, supra, for forming a bulk hybrid orientation Si substrate. In this version of ATR, the first semiconductor layer being amorphized is on the top and the second semiconductor layer acting as a template is on the bottom. Specifically, FIG. 1A shows the starting substrate 10 which comprises a top silicon layer 20 having a first surface orientation, a bottom silicon layer or substrate 30 having a second surface orientation different from the first, and a bonded interface 40 between them. FIG. 1B shows the substrate of FIG. 1A (designated now as 10') after formation of dielectric-filled shallow trench isolation (STI) regions 50. Selected regions of top Si layer as 20' are then subjected to amorphizing ion implant 60 to produce one or more amorphized regions 70, as shown in FIG. 1C. The amorphizing ion implant 60 would typically be performed with Si or Ge ions. Amorphized regions 70 span the entire thickness of the upper Si layer 20", and extend into the lower Si layer 30'. The amorphized regions 70 are then recrystallized into the second surface orientation, using the lower Si layer 30' as a template, to produce (idealized) planar hybrid orientation substrate 80 with recrystallized, changed-orientation Si region 90 as shown in FIG. 1D. In this example, the orientations of Si regions 30" and 90 may have a (100) surface orientation, while the Si regions 20" may have a (110) surface orientation.

It should be noted that the notation (jkl) indicates a family of crystal planes with Miller indices j, k, and l, and that the notation <j'k'l'> indicates a family of equivalent directions with Miller indices j', k', and l'. Here and in the remainder of this application, the "in-plane <j'k'l'> direction" of a crystal having a (jkl) surface orientation should be taken as referring to <j'k'l'> directions which are coplanar with the (jkl)-oriented crystal's surface.

In contrast to the idealized outcome shown in FIG. 1D, recrystallization of the amorphized Si region 70 in the structure of FIG. 1C more typically results in a structure like that of FIG. 2, where changed-orientation Si region 90 includes trench-edge defects 99. For the case in which changed-orientation Si region 90 has a (100) surface orientation and rectilinear sides aligned with the Si crystal's in-plane <110> directions, the trench-edge defects form a continuous band of defective Si 99, as shown in the top view of FIG. 3A. These trench-edge defects, associated with slow-growing (111) planes encountered during recrystallization, have been described by N. Burbure and K. S. Jones "The effect of oxide trenches on defect formation and evolution in ion-implanted silicon," Mat. Res. Soc. Symp. Proc. 810 C4.19.1 (2004). These trench-edge defects are very stable and cannot be removed even by annealing at 1325C for 5 hours.

As discussed in U.S. patent application Ser. No. 11/142,646, Si device regions with these trench-edge defects are not suitable for FETs whose geometry requires the FET's gate to cross over the trench-edge defects, as shown in FIG. 3B, where nFET 105 on the structure of FIG. 3A comprises gate 114 and source and drain regions 116 and 118. Defective edge regions 99 that pass directly under gate 114 provide a potentially low-resistance leakage path between the FET's source and drain regions.

As further described in U.S. patent application Ser. No. 11/142,646, ATR process sequences in which the STI patterning is performed after ATR may be used to avoid the trench-edge defect problem encountered with "ATR-after-STI" process sequences. While these "ATR-before-STI" alternatives still leave defective border regions between changed-orientation and original-orientation RX regions, the defective border regions can be removed and replaced by STI. However, this approach starts to become problematic when device scaling requires the original-orientation and changed-orientation Si regions to be separated by isolation regions narrower than the width of the defective border regions (usually about the thickness of the direct silicon bonded (DSB) layer being amorphized). In addition, the ATR-before-STI approach typically requires additional alignment steps, since the patterned amorphization and recrystallization does not leave anything to which the STI level could be aligned (in contrast to the ATR-after-STI approach in which the patterned ATR is easily aligned to the STI shapes).

The trench-edge defects described by Burbure and Jones supra are also seen in the source/drain (S/D) regions of FETs fabricated in (100)-oriented Si for cases in which the source/drain processing includes an amorphization and recrystallization step. (S/D amorphization is a preferred adjunct of the doping process because it improves dopant activation.) This is illustrated in FIGS. 4A-4H, where FIGS. 4A-4D are top view pictorial representations and FIGS. 4E-4F are cross section views through lines 4E-4E, 4F-4F, 4G-4G, and 4H-4H of FIGS. 4A-4D respectively. Rectilinear Si device region 140 having a (100) surface orientation and surrounded by STI 150 is first formed with the edge alignment and orientation shown in FIG. 4A (cross section view FIG. 4E). Gate 160 (or gate footprint 160' in the top view figures) with underlying gate dielectric 161 is then formed on Si device region 140 (FIGS. 4B and 4F), followed by ion implantation (using gate 160 as a mask) to form amorphized and doped S/D regions 170 (FIGS. 4C and 4G). Recrystallized S/D regions 171 and trench-edge defects 180 resulting from the recrystallization/dopant activation anneal are shown in FIGS. 4D and 4H. Because the implant is performed using the gate as a mask, the trench-edge defects do not extend under the gate as they do for the blanket amorphization case of FIG. 3B. However, these defects are still a concern, especially when their dimensions start approaching those of the source and drain.

SUMMARY OF THE INVENTION

It is therefore an object of the present invention to provide improved ATR methods for fabricating trench-edge-defect-free hybrid orientation substrates wherein the improved ATR methods offer the convenience and scalability of ATR-after-STI approaches without the trench-edge-defect drawbacks of ATR-after-STI approaches.

It is a more specific object of the present invention to provide improved ATR-after-STI methods for fabricating hybrid orientation substrates comprising trench-edge-defect-free (110)-oriented Si device regions suitable for forming high performance pFETs and trench-edge-defect-free (100)-oriented Si device regions suitable for forming high performance nFETs.

It is an additional object of this invention to provide hybrid orientation substrates on which high performance CMOS may be fabricated.

It is an additional object of this invention to provide CMOS circuits on such hybrid orientation substrate structures.

It is a more specific object of this invention to provide CMOS circuits on such hybrid orientation substrate structures wherein nFETs of the CMOS circuits are disposed in (100)-oriented Si and comprise trench-edge-defect-free source/drain regions with dopant activation comparable to what is normally only achieved with implant processing that involves an amorphization and recrystallization.

In accordance with the above listed and other objects, we teach that STI-bordered amorphous Si regions recrystallizing into a (100) surface orientation will form trench-edge defects when the STI edges are aligned with the (100) crystal's in-plane <110> directions, but will not form trench-edge defects when the STI edges are azimuthally rotated by 45° to align with the (100) crystal's in-plane <100> directions. Trench-edge defects resulting from recrystallization may thus be avoided with edge-angle-optimized solid phase epitaxy in which the edges of amorphized regions recrystallizing to a (100) orientation are aligned with the (100) crystal's in-plane <100> directions. Since the rectilinear device regions of FETs fabricated in (100) Si are nearly always aligned with the crystal's in-plane <110> directions, a change is required in the relative alignment of the mask and the wafer to achieve trench-edge-defect-free recrystallization. One may keep the original wafer orientation and rotate the device region patterns by 45°, or keep the device region patterns the same and rotate the wafer; generally wafer rotation is preferred. Typically wafer rotation would be accomplished by repositioning the notch from its usual position marking a <110> direction to a position marking a <100> direction.

Because the performance of nFET devices on (100) Si is insensitive to gate alignment (i.e., about the same performance is expected for gates aligned along the (100) crystal's <110> or <100> directions; see, for example, "New Stress Inducing Technique of Epitaxial Si on Recessed S/D Fabricated in Substrate Strained-Si of <100>-Channel on Rotated Wafers," by T. Sanuki et al. in IEDM 2004 Paper 9.3), the disclosed edge-angle-optimized solid phase epitaxy provides a means to eliminate trench-edge defects without impacting nFET device performance. The above teachings may thus be applied to the fabrication of hybrid orientation substrates with trench-edge-defect-free (100) Si regions formed by ATR, as well as to nFETs in (100)-oriented Si fabricated with trench-edge-defect-free amorphized-and-recrystallized source/drain regions.

Regarding hybrid orientation substrate fabrication, we teach the application of ATR-after-STI methods to a narrow subset of starting substrates, namely twist-angle-optimized direct silicon bonded substrates formed by a bonding process in which two semiconductor layers having different surface orientations are bonded to each other at an optimal azimuthal twist angle. The azimuthal twist angle is the angle formed between notches made in a semiconductor wafer corresponding to a crystalline direction. For example, commercial wafers having a (100) surface normally have a notch indicating the <110> direction. Some specialty wafers having a (100) surface have a notch indicating the <100> direction. Commercial wafers having a (110) surface normally have a notch indicating the <100> direction. The azimuthal twist angle is the angle between the notches or respective crystalline directions when the wafers are direct silicon bonded to one another. With a properly selected twist angle between to crystalline layers, the amorphous/templated recrystallization produces the unanticipated and highly advantageous result of trench-edge-defect-free recrystallization, a result not generally possible with the broader category of direct silicon bonded substrates described previously only as "a first semiconductor layer having a first orientation directly bonded to a second semiconductor layer having a second orientation different from the first."

A basic embodiment of the present invention thus provides a method for forming a trench-edge-defect-free hybrid orientation substrate, wherein the method comprises forming a twist-angle-optimized direct-silicon-bonded (DSB) bilayer comprising a single-crystal Si layer having a (100) surface orientation directly bonded to a single-crystal Si layer having a (110) surface orientation, the layers oriented in such a manner so as to have one of the (100) layer's in-plane <100> directions aligned parallel to the (110) layer's in-plane <100> direction;

selecting one or more first Si bilayer regions and one or more second Si bilayer regions, wherein the (110)-oriented Si in the first bilayer regions will retain their original (110) surface orientation and the (110)-oriented Si in the second bilayer regions will undergo an orientation change to a (100) surface orientation in the second bilayer regions;

forming trench isolation around the first and second Si bilayer regions to produce isolation-bordered first and second Si bilayer regions having edges aligned along the (100) layer's in-plane <100> directions;

amorphizing the entirety of the (110)-oriented layer in the second Si bilayer regions to form localized amorphized regions while leaving at least some of the (100)-oriented layer in the second Si bilayer regions crystalline; and recrystallizing the localized amorphized regions using the crystalline regions of the (100)-oriented layer in the second Si bilayer regions as a template, thereby changing the orientation of the localized amorphized regions from their original (110) surface orientation to a (100) surface orientation.

The amorphizing would typically be accomplished by ion implantation through a mask, and the recrystallization would typically be accomplished by some type of annealing. Though perfect alignment is preferred (i.e., an in-plane <100> direction of the (100) layer exactly aligned with the in-plane <100> direction of the (110) layer), the present invention is envisioned as covering bilayers bonded with twist angles within plus or minus 10° of this optimum alignment.

The twist-angle-optimized DSB bilayer described above may comprise, for example, a single-crystal Si layer having a (110) surface orientation directly bonded to an underlying bulk Si substrate having a (100) surface orientation. Alternatively, the DSB bilayer may comprise a single-crystal Si layer having a (110) surface orientation directly bonded to an underlying Si-on-insulator substrate layer having a (100) surface orientation.

In yet another embodiment of the invention, the twist-angle-optimized DSB bilayer may comprise a single-crystal Si layer having a (100) surface orientation directly bonded to an underlying Si-on-insulator substrate layer having a (110) surface orientation;

the localized amorphized regions may comprise a buried amorphous layer; and the first and second Si bilayer regions may be uniformly thinned enough to expose the (110) layer in the first Si regions after the step of recrystallizing.

Wherein the layers of the twist-angle-optimized DSB bilayer above have been described as two Si layers, these layers may be replaced by semiconductors selected from the group containing Si, Ge, Si-containing semiconductors such as SiGe alloys, C-containing Si or C-containing SiGe, these materials further including dopants, layered combinations of these materials, these materials in any combination of strained and unstrained semiconductor layers. For example, a twist-angle-optimized DSB bilayer may comprise a strained Si layer having a first orientation bonded to an unstrained/relaxed Si substrate layer having a second orientation.

Various ATR methods shown in U.S. patent application Ser. No. 10/725,850 and Ser. No. 11/142,646, supra, also fall within the intended scope of the present invention when used with twist-angle-optimized bonding and edge-angle-optimized solid phase epitaxy. For example, the basic embodiment above may performed with top amorphization and bottom templating; with bottom amorphization and top templating (with a bilayer DSB stack on insulator); with the introduction of buried insulator layers created after ATR; and with the amorphization and recrystallization steps replaced by or supplemented with laser annealing processes that involve a melting step.

The hybrid orientation substrate structures produced by the method of the present invention may be further processed to form additional devices and circuits such as CMOS circuits having nFETs on (100)-oriented Si and pFETs on (110)-oriented Si.

An additional embodiment of the invention provides bulk and SOI hybrid orientation substrate comprising first single crystal Si regions having a (100) surface orientation and second single crystal Si regions having a (110) surface orientation, wherein first and second Si regions are oriented so that the in-plane <100> direction of the (110)-oriented Si is aligned parallel to an in-plane <100> direction of the (100)-oriented Si.

An additional embodiment of the invention provides CMOS circuits on these hybrid orientation substrates, wherein at least one nFET of said CMOS circuit is disposed in one of said first single crystal Si regions having a (100) surface orientation and at least one pFET of said CMOS circuit is disposed in one of said second single crystal Si regions having a (110) surface orientation. More particularly, this invention provides CMOS circuits on these hybrid orientation substrates wherein the at least one pFET disposed in (110)-oriented Si is aligned so that channel current flow occurs in the in-plane <110> direction and the at least one nFET disposed in (100)-oriented Si is aligned so that channel current flow occurs in the in-plane <100> direction.

An additional embodiment of the invention teaches nFET device structures comprising source/drain regions produced with edge-angle-optimized solid phase epitaxy in order to obtain trench-edge-defect-free source/drain regions with dopant activation comparable to what is normally only achieved with implant processing that involves an amorphization and recrystallization (vs. the trench-edge-defect-free S/D regions that may be obtained with no amorphization but with lower dopant activation). In particular, we teach nFET device structures in CMOS circuits on hybrid orientation substrates, wherein the nFET structures are disposed in STI-surrounded regions of (100)-oriented Si device regions comprising edges aligned with the (100) crystal's in-plane <100> directions, and wherein pFETs of said CMOS circuits are disposed in (110)-oriented Si device regions.

BRIEF DESCRIPTION OF THE DRAWINGS

These and other features, objects, and advantages of the present invention will become apparent upon consideration of the following detailed description of the invention when read in conjuction with the drawing, in which:

FIGS. 4A-4H illustrate, in top view (FIGS. 4A-4D) and cross section view (FIGS. 4E-4H), how the steps of S/D processing produce trench-edge defects when applied to a conventionally aligned FET in a (100) Si device region;

FIGS. 5A-5D illustrate, in top views (FIGS. 5A and 5B) and cross section views (FIGS. 5C and 5D), how STI edge angle may be used to control trench-edge defect formation in STI-bounded regions of a-Si recrystallizing into a (100) surface orientation: before recrystallization (shown in FIGS. 5A and 5C), and after recrystallization (shown in FIGS. 5B and 5D)

FIGS. 6A-6D illustrate, in top view (FIGS. 6A and 6B) and cross section view (FIGS. 6C and 6D), how STI edge angle may be used to control trench-edge defect formation in STI-bounded regions of a-Si recrystallizing into a (110) surface orientation: amorphous regions before recrystallization are shown in FIGS. 6A and 6C, and the same regions after recrystallization are shown in FIGS. 6B and 6D;

FIGS. 7A-7H show, in top view (FIGS. 7A-7D) and cross section view (FIGS. 7E-7H), how an FET with trench-edge-defect-free S/D regions may be produced with amorphizing S/D implants when the FET is formed in a STI-bounded Si device region having a (100) surface orientation and the <100> edge alignment taught in the present invention;

DETAILED DESCRIPTION OF THE INVENTION

Figure 1A:
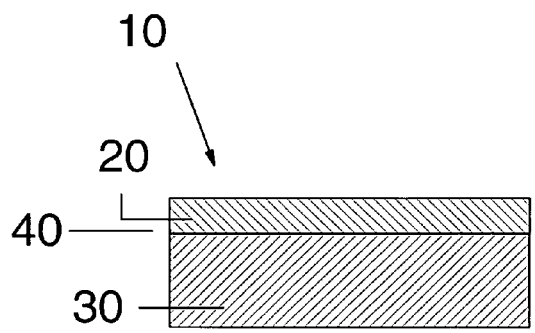
FIGS. 1A-1D illustrate, in cross section view, the steps of an idealized top amorphization/bottom templating STI-before-ATR prior art process for forming a hybrid orientation Si substrate.
Figure 1B:
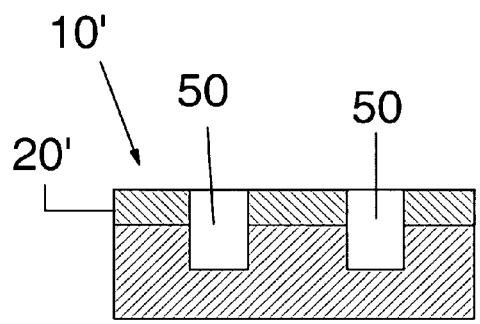
Figure 1C:
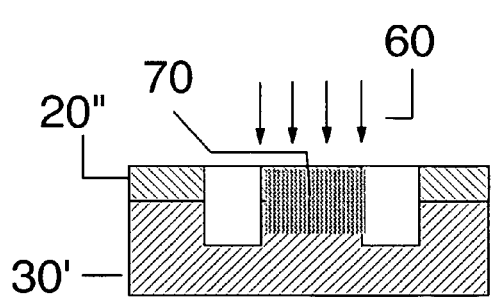
Figure 1D:
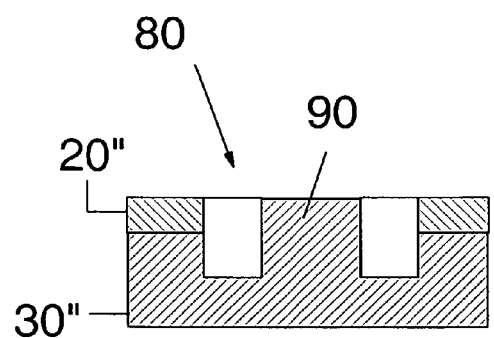
Figure 2:
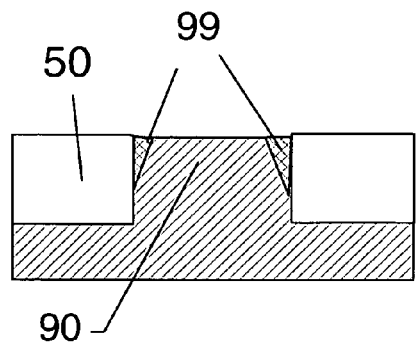
FIG. 2 shows a cross section view of the trench-edge defects remaining in the STI-bordered ATR'd region after the prior art STI-before-ATR process of FIG. 1.
Figure 3A:
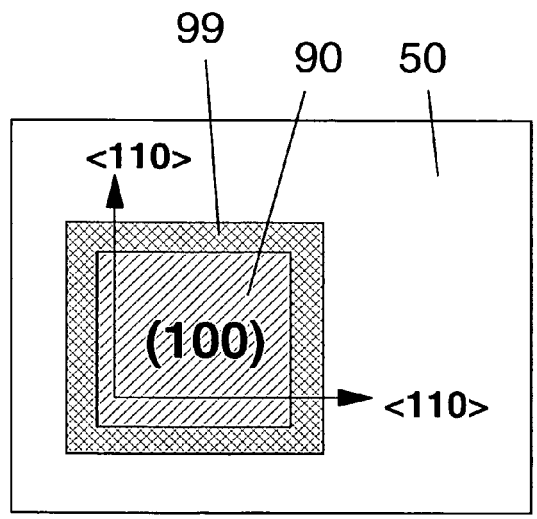
FIG. 3A shows a top view of the STI-bordered ATR'd region of FIG. 2 for the case of a (100) surface orientation.
Figure 3B:
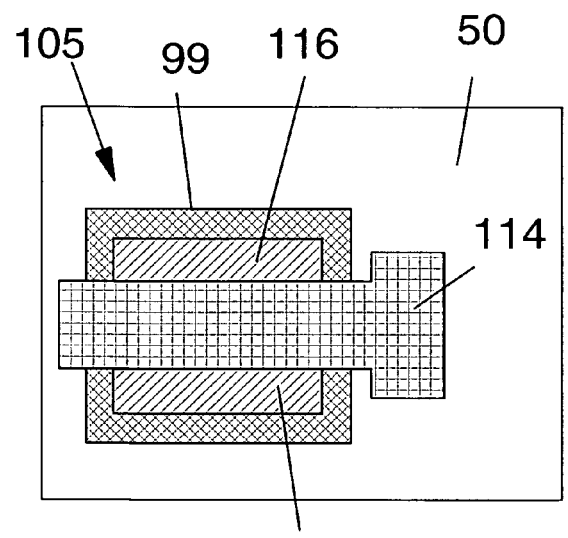
FIG. 3B shows a top view of the structure of FIG. 3A further including a FET device.

The present invention will now be described in more detail by referring to the drawings that accompany the present application. In these drawings, like and corresponding elements are referred to by like reference numerals. It is also noted that the drawings of the present invention representing the structures during the various processing steps of the present invention are provided for illustrative purposes and are thus not drawn to scale.

Reference is first made to FIGS. 5A-5D, which illustrate how STI edge angle may be used to control trench-edge defect formation in STI-bounded regions of a-Si recrystallizing into a (100) surface orientation. FIG. 5A shows a top view and FIG. 5C shows a cross section view through the line 5C-5C of FIG. 5A of square-shaped a-Si region 300 and 45°-rotated square-shaped a-Si region 310, both bounded laterally by STI 320 and bounded below by a layer of single crystal Si 330 having a (100) surface orientation and the indicated in-plane crystal directions <j'k'l'>. FIGS. 5B and 5D show the structures of FIGS. 5A and 5C after a recrystallization anneal, with FIG. 5B showing a top view and FIG. 5D showing a cross section view (through the line 5D-5D of FIG. 5B). Square-shaped region 300 with STI edges aligned along the (100) crystal's <110> directions recrystallizes into single crystal region 300' with trench-edge defects 340, whereas rotated-square-shaped region 310 with edges aligned along the (100) crystal's <100> directions recrystallizes into single crystal region 310' without trench-edge defects. However, it should be noted that while trench-edge defects along the trench edges have been eliminated from rotated-square-shaped regions 310, these regions will still have defective corners 342 where trench edges meet. Unlike trench-edge defects 340, these defects do not impact device performance since they will not be directly under the path of any subsequently applied gates. These different patterns of defect formation arise from differences in the relative orientations of the crystal's (111) planes and the a-Si/c-Si growth front.

Figure 5E:
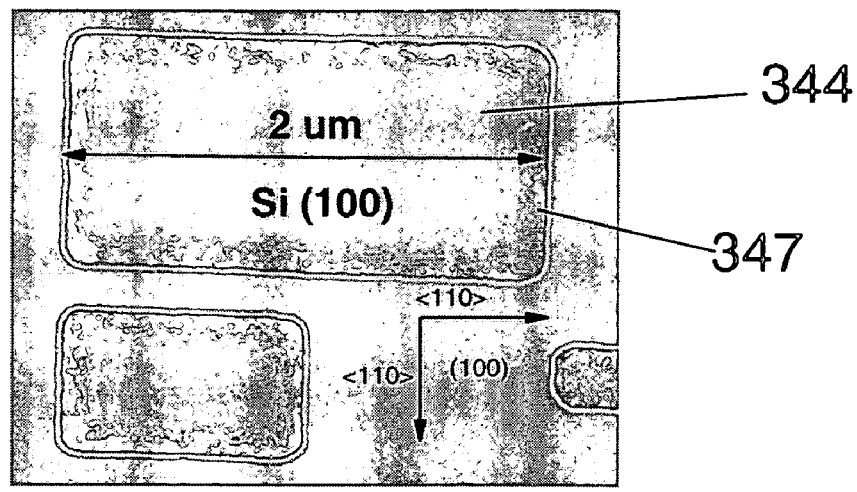
FIGS. 5E and 5F show the analogous top view scanning electron micrograph (SEM) images of STI-bounded regions of a-Si recrystallizing into a (100) surface orientation for the cases of STI edges aligned with the (100) crystal's <110> directions (FIG. 5E) and <100> directions (FIG. 5F)
Figure 5F:
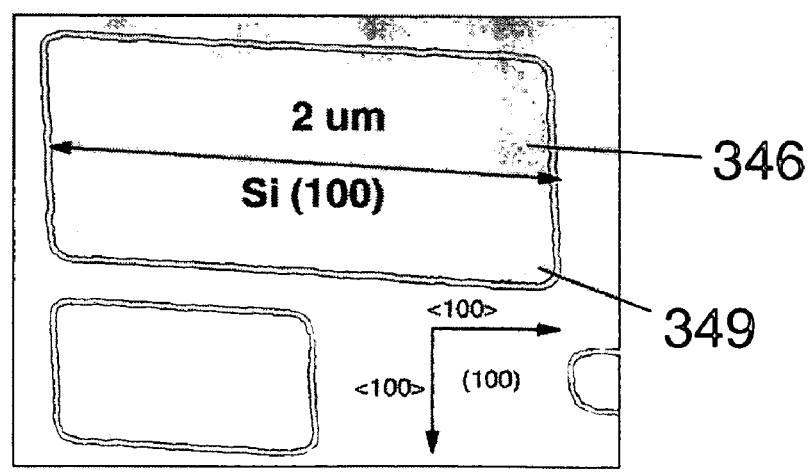

FIGS. 5E and 5F show topview SEM images (after Secco etching) corresponding to the schematics of FIG. 5B. STI-bounded Si regions 344 and 346 were amorphized with an implant of $2.0 \times 10^{15}/cm^2$ 220 keV Ge$^+$ and then annealed in $N_2$ at 900° C. for 6 min. STI-bounded Si region 344 with STI edges parallel to the (100) crystal's <110> direction recrystallizes with trench-edge defects 347 on all trench edges shown in FIG. 5E, whereas STI-bounded Si region 346 with STI edges parallel to the (100) crystal's <100> direction recrystallizes with defects 349 only at corners of Si region 346.

Reference is now made to FIGS. 6A-6D, which illustrate how STI edge angle may be used to control trench-edge defect formation in STI-bounded regions of a-Si recrystallizing into a (110) surface orientation. FIG. 6A shows a top view and FIG. 6C shows a cross section view through line 6C-6C of FIG. 6A of square-shaped a-Si region 350, 45°-rotated squared-shaped a-Si region 360, and diamond-shaped a-Si region 370, all bounded laterally by STI 320 and bounded below by a layer of single crystal Si 380 having a (110) surface orientation and the indicated in-plane crystal directions <j'k'l'>. FIGS. 6B and 6D show the structures of FIGS. 6A and 6C after a recrystallization anneal, with FIG. 6B showing a top view and FIG. 6D showing a cross section view through line 6D-6D of FIG. 6B of square-shaped region 350 with edges aligned along the (110) crystal's <110> and <100> directions recrystallizes into single crystal region 350' with trench-edge defects 390 present on edges aligned along the crystal's <110> direction (i.e., on edges normal to the crystal's <100> direction) but absent on edges aligned along the crystal's <100> direction (i.e., on edges normal to the crystal's <110> direction). In contrast, diamond-shaped regions 370 with edges aligned along the (110) crystal's <111> directions recrystallize into single crystal region 370' without any trench-edge defects. Trench-edge defects are also typically absent from the edges of rotated-square-shaped regions after recrystallization into single crystal regions 360'. While the edges of square region 360' shape do not align with any particular crystal planes, the edges are within about 10° of the crystal's <111> directions. As with the case of recrystallization into (100) Si, these different behaviors arise from differences in the relative orientations of the crystal's (111) planes and the a-Si/c-Si growth front.

Figure 7A:
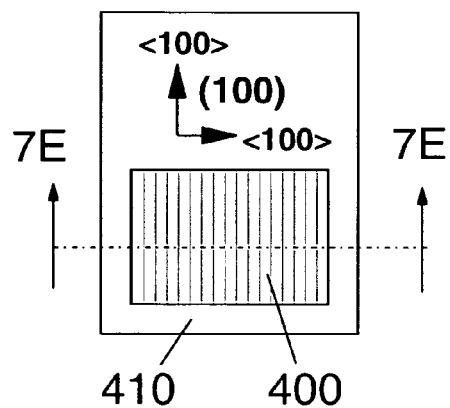
Figure 7B:
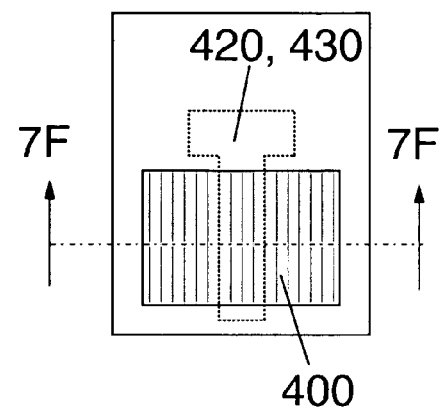
Figure 7E:
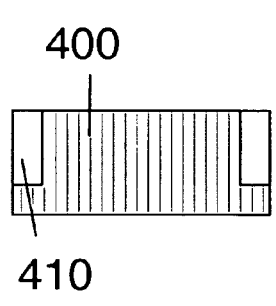
Figure 7F:
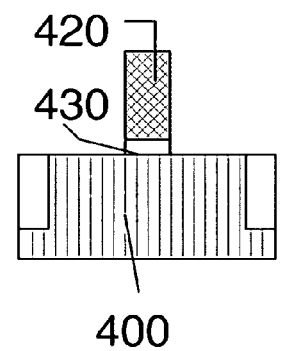

FIGS. 7A-7H show, in top view (FIGS. 7A-7D) and cross section view (FIGS. 7E-7H, through lines 7E-7E, 7F-7F, 7G-7G, and 7H-7H in FIGS. 7A-7D respectively), how an FET with trench-edge-defect-free S/D regions may be produced with amorphizing S/D implants when the FET is formed in a STI-bounded Si device region 400 having a (100) surface orientation and the <100> edge alignment taught in the present invention. FIGS. 7A and 7E show Si device region 400, with sides bounded by STI 410, before gate formation. FIGS. 7B and 7F show the structures of FIGS. 7A and 7E after deposition and patterning of gate 420 and gate dielectric 430. Gate 420 and gate dielectric 430 are shown only as a footprint in FIGS. 7B-7D to better view Si device region 400 below gate 420. FIGS. 7C and FIGS. 7G show the structures of FIG. 7B and 7F after a source/drain implantation to form amorphized source/drain regions 440 and 442 separated by non-amorphized channel region 444. The amorphizing effect of the implant on gate 420 is not shown in FIGS. 7C and 7G. FIGS. 7D and 7H show the structures of FIGS. 7C and 7G after a recrystallization/activation anneal to produce FET 450 with trench-edge-defect-free source/drain regions 440' and 442'.

Figure 8A:
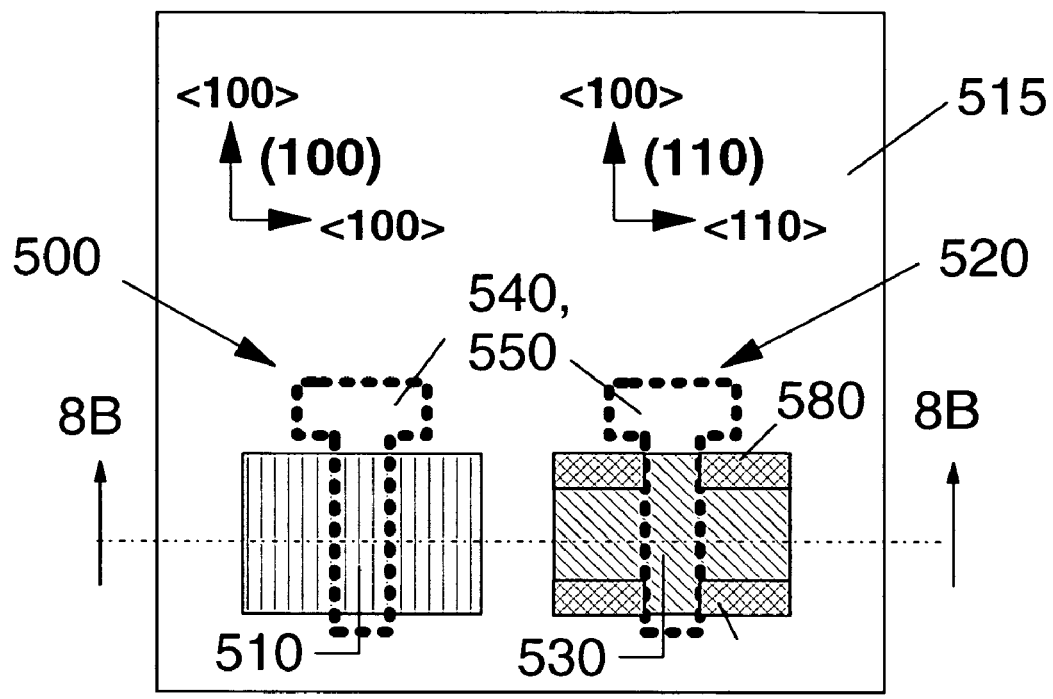
FIGS. 8A-8B show, in top view (FIG. 8A) and cross section view (FIG. 8B), how a trench-edge-defect-free nFET of the present invention might be incorporated into a bulk hybrid orientation substrate with the nFET on (100) Si and a pFET on a (110) Si DSB layer.
Figure 8B:
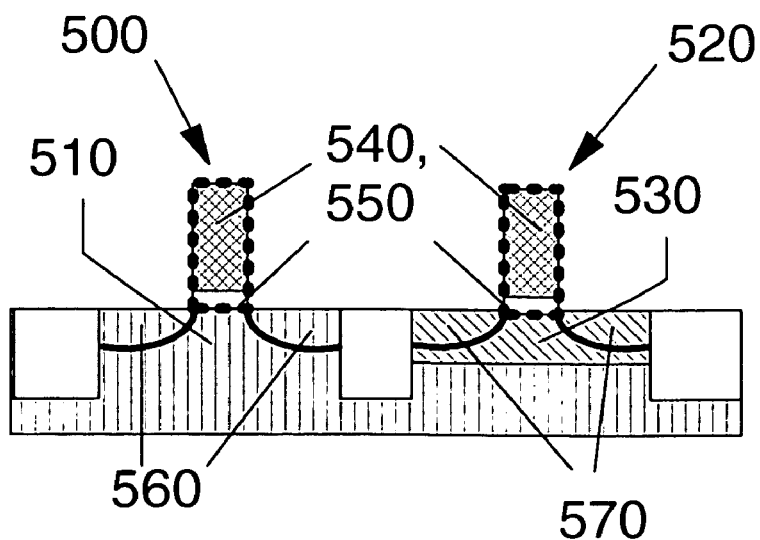

FIGS. 8A-8B illustrate a top view (FIG. 8A) and cross section view in (FIG. 8B taken through line 8B-8B of FIG. 8A) of the trench-edge-defect-free S/D regions that may be produced when S/D processing is applied to nFETs of the present invention incorporated into a bulk hybrid orientation substrate. FIG. 8A shows nFET 500 on (100)-oriented nFET Si device region 510 bordered by STI 515 and pFET 520 on (110)-oriented pFET Si device region 530 bordered by STI 515, with device regions 510 and 530 aligned as shown in the FIG. 8A. Gate 540 and gate dielectric 550 are shown only as a footprint in FIG. 8A to better view the Si below the gate. Following amorphizing S/D implants and a recrystallization/activation anneal, nFET Si device region 510 having a (100) orientation will comprise trench-edge-defect-free source/drain regions 560, and pFET Si device region 530 having a (110) orientation will comprise source/drain regions 570 that have trench-edge defects 580 on some edges but not on other edges shown in FIG. 8A.

Figure 9A:
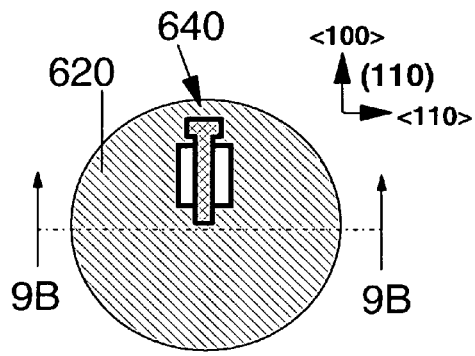
FIG. 9A-9C show a top view in FIG. 9A and cross section views in FIGS. 9B and 9C of a DSB bilayer substrate taught by the present invention as a preferred starting point for fabricating bulk hybrid orientation substrates by ATR-after-STI methods.
Figure 9D:
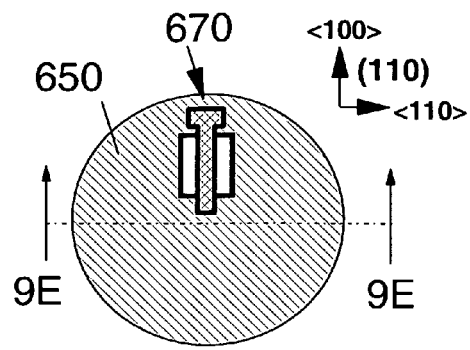
FIG. 9D-9F show a top view in FIG. 9D and cross section views in FIGS. 9E and 9F of a DSB bilayer substrate taught away from the present invention, wherein the FET insets indicate preferred gate and S/D alignments for the nFETs that will be formed in (100) Si and for the pFETs that will be formed in (110) Si.
Figure 9B:
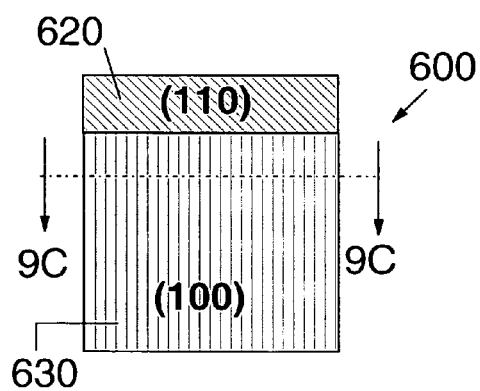
Figure 9E:
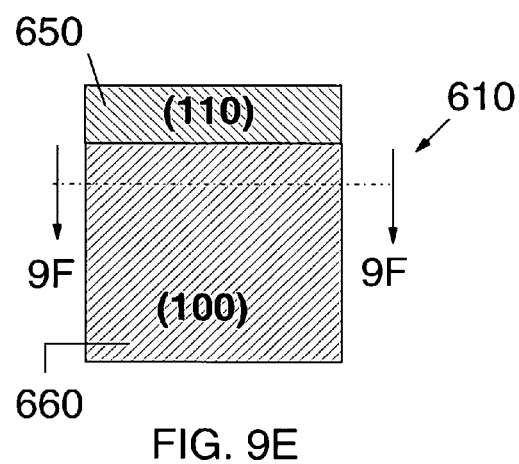
Figure 9C:
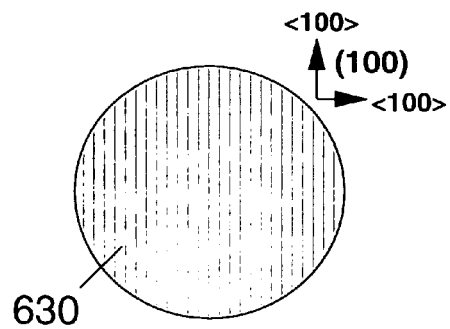

FIG. 9A shows a top view and FIG. 9B shows a cross section view of a DSB substrate 600 taught by the present invention as a preferred starting point for fabricating bulk hybrid orientation substrates by ATR-after-STI method. DSB substrate 600 (shown in cross section in FIG. 9B through line 9B-9B of FIG. 9A. and again in cross section view in FIG. 9C through line 9C-9C of FIG. 9B) comprises DSB layer 620 having a (110) surface orientation and base substrate wafer 630 having a (100) surface orientation bonded to each other with the indicated alignment of in-plane crystal directions (i.e., <100> directions together). In FIG. 9A, top view FET inset 640 indicates the preferred gate and S/D alignments for the nFETs that will be formed in (100) Si and for the pFETs that will be formed in (110) Si after the desired changes in surface orientation have been effected.

Figure 9F:
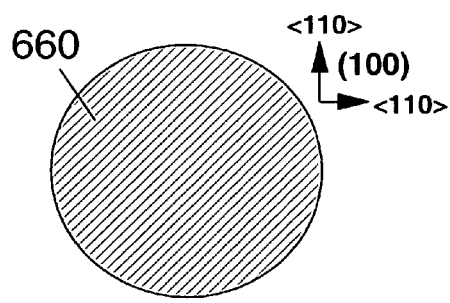

FIG. 9D shows a cross section view of a DSB 610 taught away from by the present invention. DSB substrate 610 (shown in cross section in FIG. 9E through line 9E-9E of FIG. 9D and again in cross section view in FIG. 9F through line 9F-9F of FIG. 9E) comprises DSB layer 650 having a (110) surface orientation and base substrate wafer 660 having a (100) surface orientation bonded to each other with the indicated alignment of in-plane crystal directions (i.e., (100)/<110> and (110)/<110> directions together). In FIG. 9D, top view FET inset 670 indicates preferred gate and S/D alignments for the nFETs that will be formed in (100) Si and for the pFETs that will be formed in (110) Si after the desired changes in surface orientation have been effected.

Figure 10A:
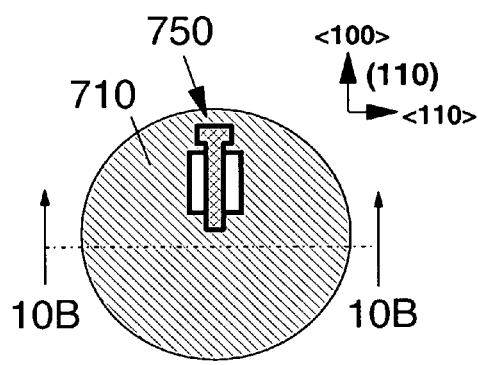
FIGS. 10A-10C show a top view in FIG. 10A and cross section views in FIGS. 10B and 10C of DSB bilayer substrates taught by the present invention as preferred starting points for fabricating hybrid orientation silicon-on-insulator substrates by ATR-after-STI methods, wherein the FET insets indicate preferred gate and S/D alignments for the nFETs that will be formed in (100) Si and for the pFETs that will be formed in (110) Si.
Figure 10D:
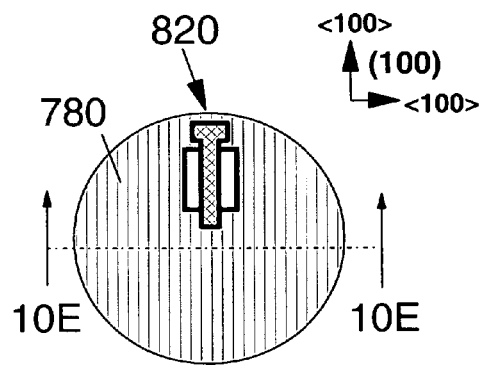
FIGS. 10D-10F show a top view in FIG. 10D and cross section views FIGS. 10E and 10F of DSB bilayer substrates taught by the present invention as preferred starting points for fabricating hybrid orientation silicon-on-insulator substrates by ATR-after-STI methods, wherein the FET insets indicate preferred gate and S/D alignments for the nFETs that will be formed in (100) Si and for the pFETs that will be formed in (110) Si.
Figure 10B:
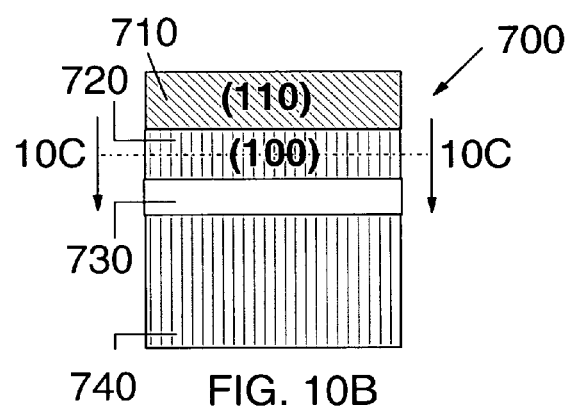
Figure 10E:
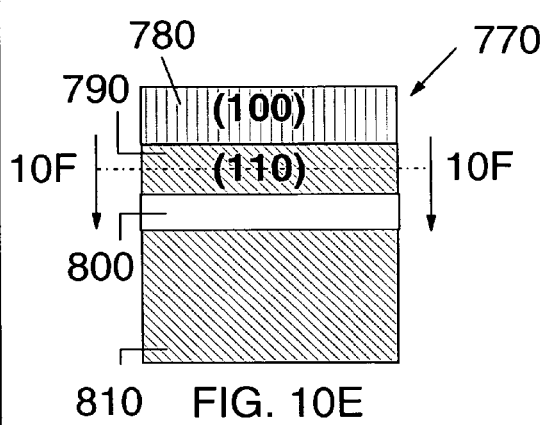
Figure 10C:
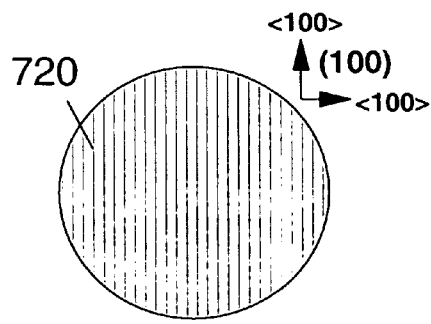

FIG. 10A shows a top view and FIG. 10B shows a cross section view of DSB-on-insulator (DSBOI) substrates taught by the present invention as preferred starting points for fabricating hybrid orientation silicon-on-insulator substrates by ATR-after-STI methods. DSBOI substrate 700 (shown in cross section view in FIG. 10B through line 10B-10B of FIG. 10A and again in cross section view in FIG. 10C through line 10C-10C of FIG. 10B) comprises DSB layer 710 having a (110) surface orientation bonded to base silicon-on-insulator (SOI) layer 720 having a (100) surface orientation with the indicated alignment of in-plane crystal directions (i.e., <100> directions together). Base SOI layer 720 is disposed on buried insulator layer 730 on base substrate 740. In FIG. 10A, top view FET inset 750 indicates preferred gate and S/D alignments for the nFETs that will be formed in (100) Si and for the pFETs that will be formed in (110) Si after the desired changes in surface orientation have been effected.

Figure 10F:
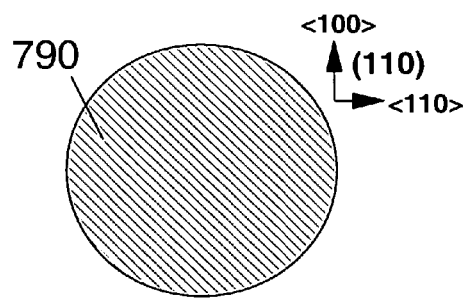

DSBOI substrate 770 (shown in cross section view in FIG. 10E through line 10E-10E of FIG. 10D and again in cross section view in FIG. 10F through line 10F-10F of FIG. 10E) comprises DSB layer 780 having a (100) surface orientation bonded to base silicon-on-insulator (SOI) layer 790 having a (110) surface orientation with the indicated alignment of in-plane crystal directions (i.e., <100> directions together). Base SOI layer 790 is disposed on buried insulator layer 800 on base substrate 810. In FIG. 10D, top view FET inset 820 indicates preferred gate and S/D alignments for the nFETs that will be formed in (100) Si and for the pFETs that will be formed in (110) Si after the desired changes in surface orientation have been effected.

Various ATR methods shown in U.S. patent application Ser. No. 10/725,850 and Ser. No. 11/142,646 fall within the intended scope of the present invention when used with twist-angle-optimized bonding and edge-angle-optimized solid phase epitaxy. These methods include top amorphization/bottom templating methods for bulk, top amorphization/bottom templating method for SOI, and bottom amorphization/top templating for SOI. Other methods falling within the intended scope of the present invention include those in which buried insulator layers are created after ATR and those in which the amorphization and recrystallization steps are replaced by or supplemented with laser annealing processes that involve a melting step.

It should be noted that the concepts of twist-angle-optimized bonding and edge-angle-optimized solid phase epitaxy for hybrid orientation substrates may also be applied to STI-bordered amorphous Si regions recrystallizing into a (110) orientation. In this case (illustrated in FIGS. 6A-6B), trench-edge-defect-free recrystallization occurs on Si edges parallel to the (110) crystal's in-plane <111> and <100> directions. Trench-edge-defect-free recrystallization is also observed in rectilinear Si shapes aligned at a 45° angle to the (110) crystal's in-plane <100> and <110> directions, suggesting that a 10° offset from an ideal alignment with the <111> direction may be tolerable. However, the performance of pFETs fabricated in (110)-oriented Si is quite sensitive to azimuthal orientation, with the bulk of the benefits of fabrication in (110)-oriented Si lost if hole current flow in the channel is not in the <110> direction. So while trench-edge-defect-free recrystallization is possible, the resulting (110) device region shapes and orientations may not be as useful since these designs would require hole current flow in directions other than the <110> direction in (110)-oriented Si.

An additional aspect of this invention provides a hybrid orientation substrate comprising first single crystal Si regions having a (100) surface orientation and second single crystal Si regions having a (110) surface orientation, wherein the first and second Si regions are oriented so that the in-plane <100> directions of the (110)-oriented Si in the second Si regions is aligned to be parallel to an in-plane <100> direction of the (100)-oriented Si in the first Si regions. Though perfect alignment is preferred (i.e., an in-plane <100> direction of the (100) layer is exactly aligned with the in-plane <100> direction of the (110) layer), the present invention is envisioned as covering hybrid orientation substrates comprising first and second single crystal Si regions having in-plane <100> directions aligned to within plus or minus 10° of parallel.

In the bulk version of these hybrid orientation substrates, the first and second Si regions would comprise bulk Si; in SOI versions of these hybrid orientation substrates, first and second Si regions would be disposed on a SOI layer, directly on an insulator layer, or on a combination of SOI and insulator layers.

More generally this invention provides variations of these hybrid orientation substrate wherein said single crystal Si regions are replaced by a semiconductor layer selected from the group containing Si, Ge, Si-containing semiconductors such as SiGe alloys, C-containing Si and C-containing SiGe, these materials further including dopants, layered combinations of these materials, these materials in any combination of strained and unstrained semiconductor layers.

A related aspect of this invention provides CMOS circuits on these hybrid orientation substrates, wherein at least one nFET of the CMOS circuit is disposed in one of the first single crystal Si regions having a (100) surface orientation and at least one pFET of the CMOS circuit is disposed in one of the second single crystal Si regions having a (100) surface orientation. More particularly, this invention provides CMOS circuits on these hybrid orientation substrates wherein the at least one pFET disposed in (110)-oriented Si is aligned so that channel current flow occurs in the in-plane <110>direction and the at least one nFET disposed in (100)-oriented Si is aligned so that channel current flow occurs in the in-plane <100> direction.

An additional related aspect of this invention provides CMOS circuits on such hybrid orientation substrates wherein the CMOS circuits comprise at least one nFET with source/drain regions produced with edge-angle-optimized solid phase epitaxy. Such nFETs are expected to have trench-edge-defect-free source/drain regions (or, more generally, source/drain regions that are trench-edge-defect-free on at least some edges) with dopant activation comparable to what is normally achieved only with implant processing involving an amorphization and recrystallization step.

As noted earlier in connection with the fabrication of twist-angle-optimized DSB bilayers, alignments within about plus or minus 10° of this optimal gate and source/drain alignment (i.e., gates and source/drain regions are aligned with one of the (100) crystal's in-plane <100> directions) are considered to be within the scope of the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention, what we claim as new and desire to secure by Letters Patent is:

1. A method for forming a hybrid orientation substrate comprising forming a direct-silicon-bonded (DSB) bilayer comprising a single-crystal Si layer having a (100) surface orientation directly bonded to a single-crystal Si layer having a (110) surface orientation, said layers oriented in such a manner so as to have one of the (100) layer's in-plane <100> directions aligned with the (110) layer's in-plane <100> direction;

selecting a plurality of first Si bilayer regions and a plurality of second Si bilayer regions, wherein said (110)-oriented Si in said first bilayer regions will retain their original (110) surface orientation and said (110)-oriented Si in said second bilayer regions will undergo an orientation change to a (100) surface orientation in said second bilayer regions;

forming tench isolation around said first and second Si bilayer regions to produce isolation-bordered first and second Si bilayer regions having edges aligned along the (100) layer's in-plane <100> directions;

amorphizing the entirety of said (110)-oriented layer in said second Si bilayer regions to form localized amorphized regions while leaving at least some of said (100)-oriented layer in said second Si bilayer regions crystalline; and recrystallizing said localized amorphized regions using said crystalline regions of said (100)-oriented layer in said second Si bilayer regions as a template, thereby changing the orientation of said localized amorphized regions from their original (110) surface orientation to a (100) surface orientation.

2. The method of claim 1 wherein said DSB bilayer comprises a single-crystal Si layer having a (110) surface orientation directly bonded to an underlying bulk Si substrate having a (100) surface orientation.

3. The method of claim 1 wherein said DSB bilayer comprises a single-crystal Si layer having a (110) surface orientation directly bonded to an underlying Si-on-insulator substrate layer having a (100) surface orientation.

4. The method of claim 1 wherein said DSB bilayer comprises a single-crystal Si layer having a (100) surface orientation directly bonded to an underlying Si-on-insulator substrate layer having a (110) surface orientation; said localized amorphized regions comprise a buried amorphous layer; and said first and second Si bilayer regions arc uniformly thinned enough to expose said (110) layer in said first Si regions after said step of recrystallizing.

5. The method of claim 1 wherein said Si layers of said DSB bilayer are replaced by semiconductor layers selected from the group consisting of Si, Ge, SiGe alloys, C-containing Si and C-containing SiGe, these materials further including dopants, layered combinations of these materials, these materials in any combination of strained and unstrained semiconductor layers.

6. The method of claim 1 wherein said amorphization is accomplished by an ion implantation.

7. The method of claim 1 wherein said recrystallization is accomplished by annealing.

8. The method of claim 1 wherein said DSB bilayer is bonded so that an in-plane <100> direction of said (100) layer is within 10° of an in-plane <100> direction of said (110) layer.

* * * * *